US005793677A

United States Patent [19]
Hu et al.

[11] Patent Number: 5,793,677
[45] Date of Patent: Aug. 11, 1998

[54] USING FLOATING GATE DEVICES AS SELECT GATE DEVICES FOR NAND FLASH MEMORY AND ITS BIAS SCHEME

[76] Inventors: Chung-You Hu, 1180 Reed Ave., No. 6, Sunnyvale, Calif. 94086; Yu Sun, 20395 Glasgow Dr., Saratoga, Calif. 95070; Chi Chang, 342 Lakeview Way, Redwood City, Calif. 94062; Sameer Haddad, 6277 Blossom Ave., San Jose, Calif. 95123

[21] Appl. No.: 668,632

[22] Filed: Jun. 18, 1996

[51] Int. Cl.⁶ .................... G11C 13/00; H01L 27/115
[52] U.S. Cl. .................... 365/185.17; 365/185.28; 365/185.05; 365/185.26; 365/185.01
[58] Field of Search .................... 365/185.03, 185.19, 365/185.21, 185.05, 185.08, 185.01, 182

[56] References Cited

U.S. PATENT DOCUMENTS

| | | | |
|---|---|---|---|
| 5,126,808 | 6/1992 | Montalvo et al. | 357/23.5 |
| 5,299,162 | 3/1994 | Kim et al. | 365/201 |
| 5,319,593 | 6/1994 | Wolstenholme | 365/185 |
| 5,464,998 | 11/1995 | Hayakawa et al. | 257/316 |
| 5,546,341 | 8/1996 | Suh et al. | 365/185.33 |

FOREIGN PATENT DOCUMENTS

| | | |
|---|---|---|
| 4407732A1 | 9/1994 | Germany. |
| 06275800A | 9/1994 | Japan. |

OTHER PUBLICATIONS

IEICE Transactions On Electronics, vol. E78–C, No. 7, 1 Jul. 1995, pp. 818–824, XP000528812 Nobukata H et al: "A 65 NS 3 V–Only NAND–Flash Memory with New Verify Scheme and Folded Bit–Line Architecture".

*Primary Examiner*—Viet Q. Nguyen
*Attorney, Agent, or Firm*—Sawyer & Associates

[57] ABSTRACT

The present invention facilitates programming of selected floating gate devices while successfully inhibiting the programming of unselected devices, without the need for growing multiple thicknesses of oxides. The preferred embodiment of the present invention utilizes a multiple select gate device. In particular, the select gate device is preferably a dual floating gate device rather than the conventional transistor (or device functioning as a conventional transistor) used in the current Flash memory systems as a select gate device.

10 Claims, 9 Drawing Sheets

USING FLOATING GATE DEVICES AS SELECT GATE DEVICES FOR NAND FLASH MEMORY AND ITS BIAS SCHEME

FIELD OF THE INVENTION

The present invention relates generally to a Flash memory architecture. More particularly, the present invention uses a plurality of floating gate devices as a select gate device in such a Flash memory architecture.

BACKGROUND OF THE INVENTION

The typical architecture used for Flash memories include a plurality of wordlines intersected with a plurality of bitlines. Located at each intersection of wordlines and bitlines are typically floating gate devices. Prior to the first wordline and after the last wordline, are the select gate drain and the select gate source along the bitline, each floating gate device is connected to the next floating gate device by connecting the source of one device to the drain of the next device. Typically, the select gate drain and the select gate source are conventional transistors or floating gate devices modified to behave like conventional transistors.

Initially, the floating gate devices are erased to a certain threshold voltage such as −2 volts. In order to program the memory, the selected floating gate devices are charged to a higher threshold voltage while the threshold voltage of the remaining floating gate devices stay unchanged.

A problem arises when it is desirable to program one floating gate device along a wordline without programming the next floating gate device on the same wordline. When a voltage is applied along a wordline, the voltage is applied not only to the desired floating gate device but also to the floating gate devices along the same wordline which are unselected for programming. To avoid programming an unselected floating gate device, conventional methods typically use a thick oxide in the transistors used for the select gate devices. However, the oxide in the floating gate devices generally need to be thin. So the conventional systems require growing two oxide thicknesses, the thin oxide for the floating gate devices to allow programming and erasing, and the thick oxide for the select gate device transistors to avoid inadvertent programming. However, when the oxide is grown in two different thicknesses, the quality of the oxide is degraded.

More background information on the subject can be found in "A 3.3v 32 Mb NAND Flash Memory with Incremental Stop Pulse Programming Scheme," IEEE J. Solid-State-Circuits, Vol. 30, no. 11, 1995, p. 1149; and "A 35 ns Cycle Time 3.3v only 32 Mb NAND Flash EEPROM," IEEE J. Solid-State-Circuits, Vol. 130, no. 11, 1995, p. 1157.

Accordingly, what is needed is a system and method for programming an individual floating gate from a plurality of floating gates without requiring different oxide thicknesses. The system should be simple, cost effective and easily implementable using existing process technologies. The present invention addresses such a need.

SUMMARY OF THE INVENTION

The present invention facilitates programming of selected floating gate devices while successfully inhibiting the programming of unselected devices, without the need for growing multiple thicknesses of oxides.

In order to accomplish this, the preferred embodiment of the present invention utilizes a multiple select gate device. In particular, the select gate device is preferably a dual floating gate device rather than the conventional transistor (or device functioning as a conventional transistor) used in the current Flash memory systems as a select gate device.

One major advantage of this architecture is the ability to use the same thickness of oxide throughout the Flash memory system. Growing one uniform thickness of oxide enhances oxide quality and allows a simpler process by eliminating the need to grow two different thicknesses of oxide. Another advantage flows from the conventional systems' use of a modified floating gate device for use as a conventional transistor. By eliminating the use of the conventional transistors as the select gate devices, the present invention avoids the step of modifying the floating gate devices for use as a conventional transistor.

The architecture of a Flash memory in accordance with the present invention comprises a select gate device which includes at least one set of a plurality of select gate device means wherein the at least one set of the plurality of select gate device means is coupled to a bitline of the plurality of bitlines.

The present invention also includes a method for program inhibit for random programming in a Flash memory. The steps of this method comprises a) providing a first voltage of a channel region of a floating gate device in which programming is undesirable, the first voltage being initially high enough to prevent the floating gate device from being programmed; b) providing a second voltage in a first select gate means included in a select gate device coupled to the device in which programming is undesirable, wherein the second voltage is less than the first voltage; and c) providing a third voltage in a second select gate means, the second gate means being included within the select gate device with a zero voltage.

DETAILED DESCRIPTION OF THE INVENTION

The present invention is directed toward an improvement in a Flash memory architecture. More particularly, this invention uses a plurality of floating gate devices as a select gate device.

The following description is presented to enable one of ordinary skill in the art to make and use the invention and is provided in the context of a patent application and its requirements. Various modifications to the preferred embodiment and the generic principles and features described herein will be readily apparent to those skilled in the art.

3

Figure 1:
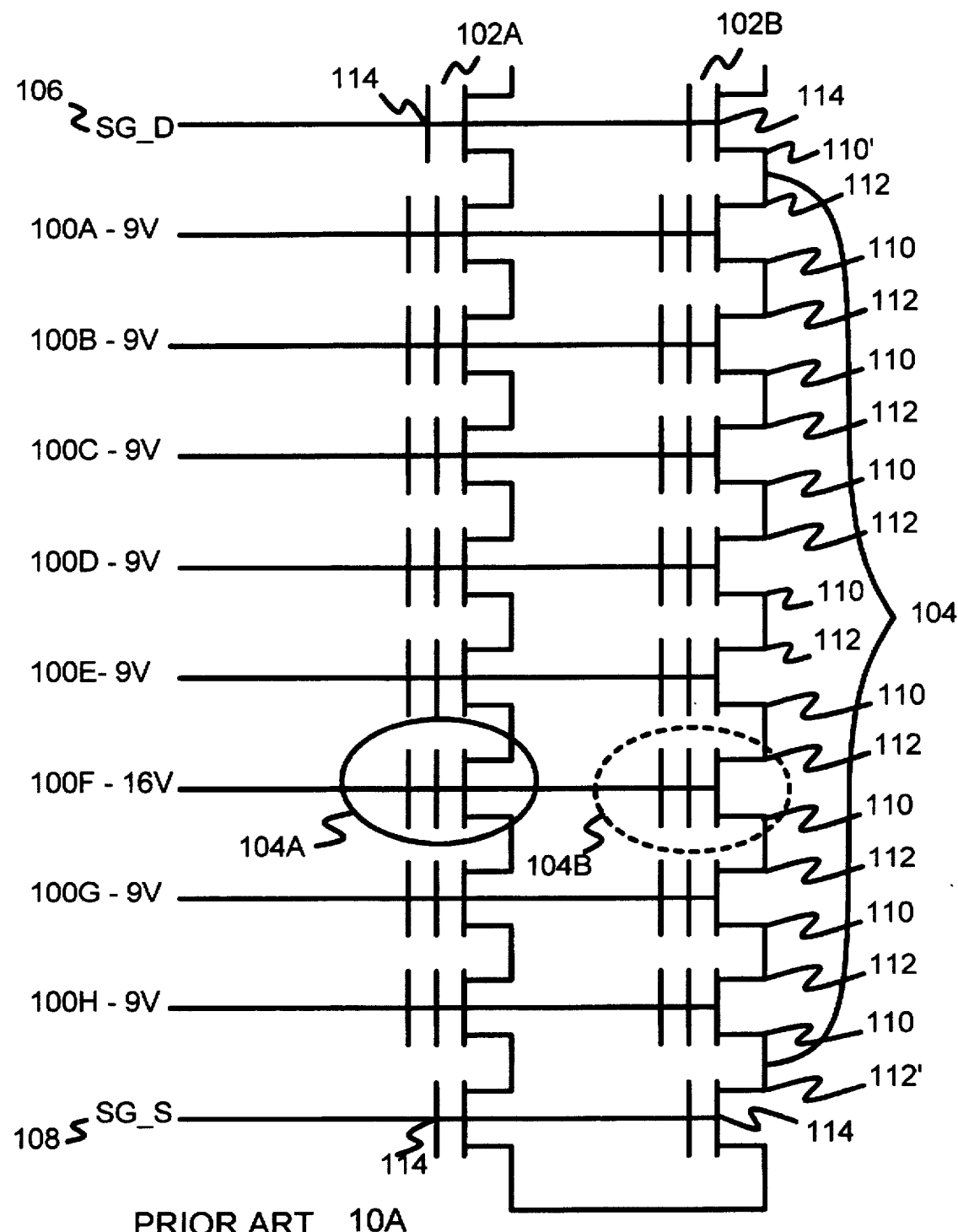
FIG. 1 is a schematic depiction of a conventional Flash memory.

FIG. 1 illustrates a basic diagram of a Flash memory 10A, otherwise known as a Flash electrically erasable programmable read only memory (EEPROM). As shown in FIG. 1, the typical architecture used for Flash memories 10A include a plurality of wordlines 100a-100h intersected with a plurality of bitlines 102a-102b. Located at each intersection of wordlines 100 and bitlines 102 are floating gate devices 104. Prior to the first wordline 100 and after the last wordline 100, are the select gate drain 106 and the select gate source 108 along the bitline 102, each floating gate device 104 is connected to the next floating gate device 104 by connecting the source 110 of one device to the drain 112 of the next device. Typically, the select gate drain 106 and the select gate source 108 are conventional transistors 114 or floating gate devices modified to behave like conventional transistors 114.

In order to program the memory 10A, some floating gate devices 104 are charged while others remain uncharged. To charge or program a single floating gate device 104 within the array, a voltage differential must be created within the floating gate device 104.

Figure 2:
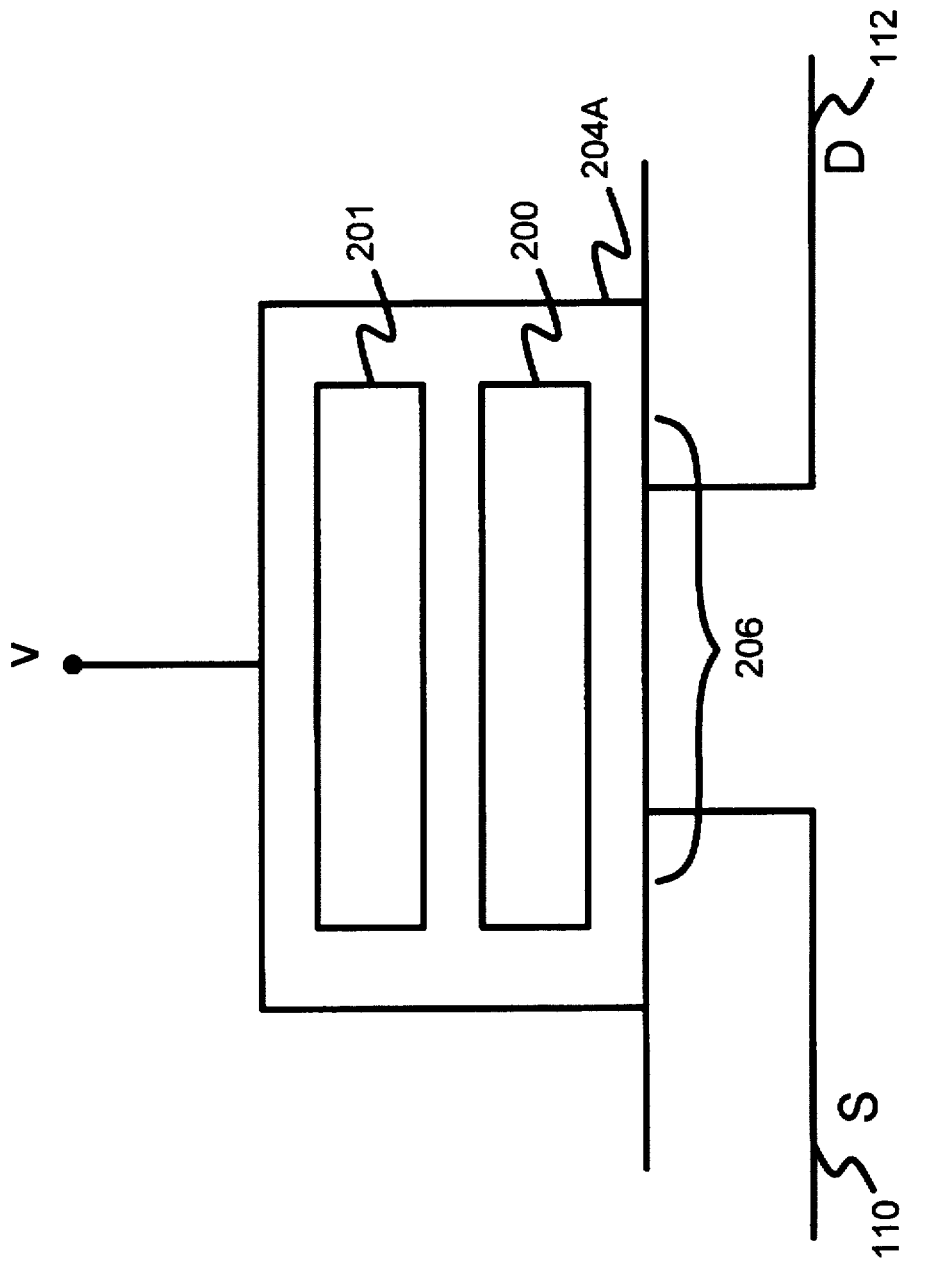
FIG. 2 is an illustration of a floating gate device.

FIG. 2 illustrates a schematic of a floating gate device 104. It includes a control gate 201, a floating gate 200, a source 110, a drain 112, and a channel region 206. A voltage differential is created in the floating gate device 104 when there is a high voltage at the floating gate (Vg) 200 and a low voltage at the channel region (Vch) 206. This voltage difference causes electrons to move from the channel region 206 to the floating gate 200. This movement of electrons from the channel region 206 to the floating gate 200 is referred to as programming. When programming, the high voltage at the floating gate 200 is created by applying a voltage to the wordline 100 associated with the particular floating gate device 104. When electrons flow from the floating gate 200 to the channel region 206, it is referred to as erasing. This flow of electrons from the floating gate 200 to the channel region 206 and vice versa occurs through a phenomenon known as oxide tunneling.

A problem arises when it is desirable to program one floating gate device 104 along a wordline 100 without programming the next floating gate device 104 on the same wordline 100. When a voltage is applied along a wordline 100, for example, wordline 100f of FIG. 1, the voltage is applied not only to the desired floating gate device 104a but also to the next floating gate device 104b which is unselected for programming. The conventional method to avoid programming unselected floating gate devices 104b is to reduce the voltage differential between the gate 200 and the channel region 206 of the unselected floating gate device 104b or devices 104.

Figure 3:
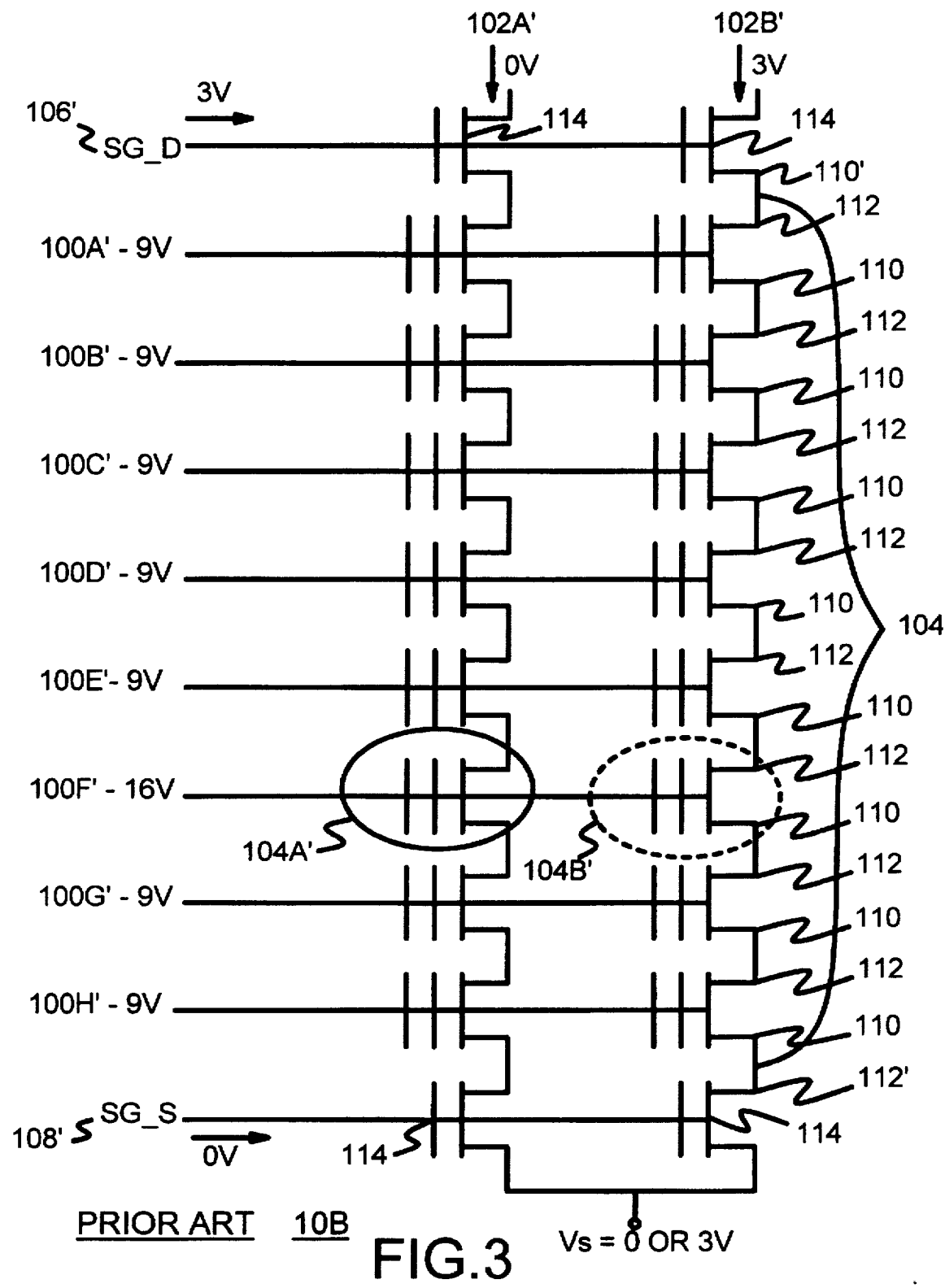
FIG. 3 is a conventional method and system of a program inhibiting scheme.

FIG. 3 illustrates one conventional system and method used to avoid programming unwanted floating gate devices. This system and method is used by companies such as Samsung, in their 4 M * 8 bit NAND Flash Memory, model KN29V32000TS-RS. In an example where a single floating gate device 104a' along bitline 102a' and wordline 100f is desired to be programmed, a high voltage such as 16 volts can be applied to wordline 100f. The remaining wordlines 100a'-100e' and 100g'-100h' can also have some small voltage applied to it such as 9v. In order to avoid programming the next floating gate device 104b' along wordline 100f, the Flash memory 10B system charges the channel region 206 of the floating gate devices 104 along bitline 102b' to a high enough voltage, for instance, 8v, to avoid programming of the unselected floating gate device 104b'.

This charging of the channel regions 206 along bitline 102b can be accomplished by providing a voltage, such as

4

3 volts, along the bitline 102b and a voltage, such as 9 volts, along the wordlines 500. Once this has occurred, no current flows through the channel regions 206 of the floating gate devices 104 along bitline 102b' since the transistor 114 along bitline 102b' is turned off. In the example shown in FIG. 3, the difference between the 3 volts supplied along the select gate drain 106' and the 3 volts supplied along bitline 102b' is not greater than the threshold voltage of the transistor 114. Since this difference must be greater than the threshold voltage, such as 1 volt, of the transistor 114 to meet the requirement of turning the transistor on, no current passes along the floating gate devices 104 along bitline 102b'.

Figure 4:
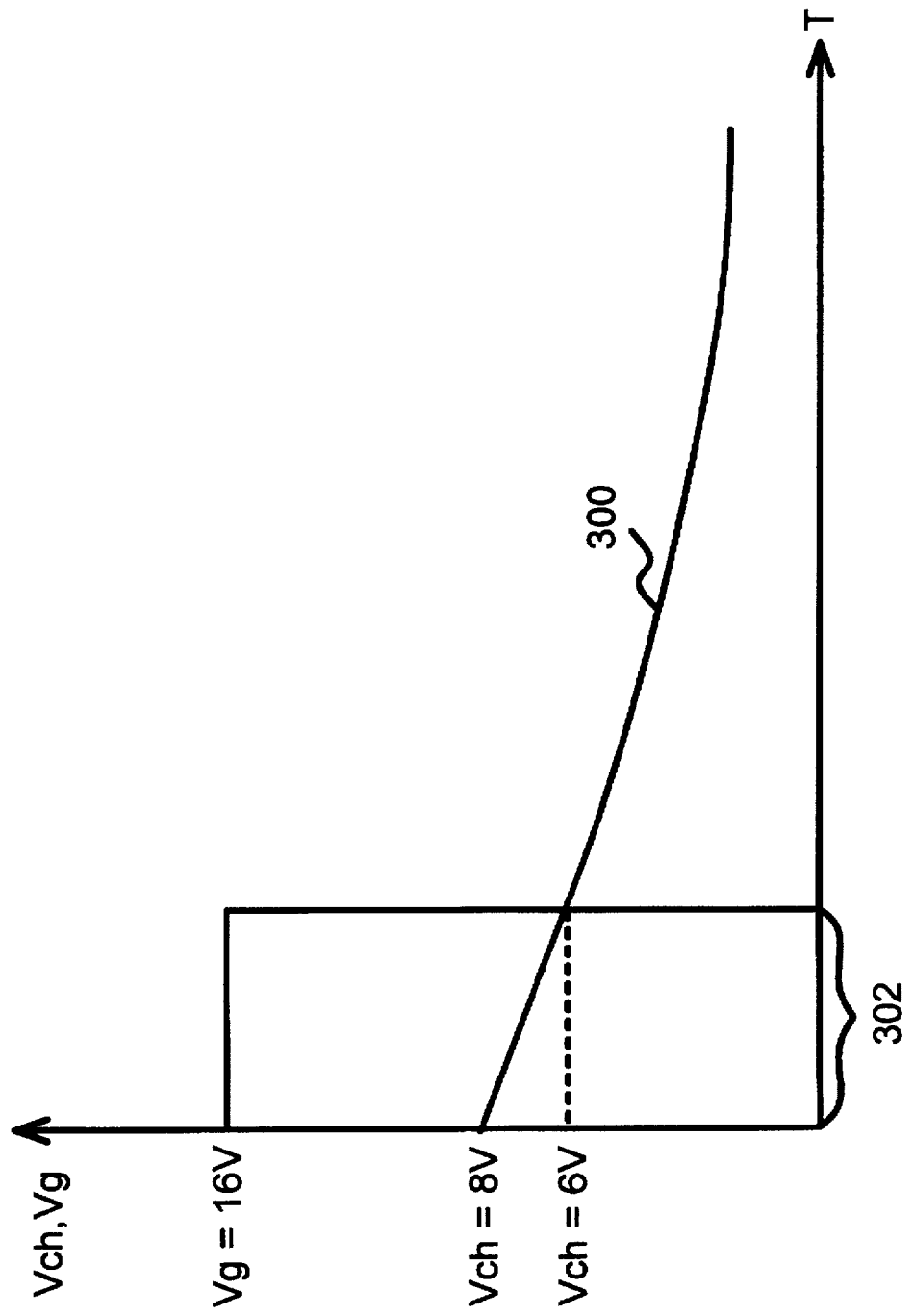
FIG. 4 is a graph of a decay curve of the voltage in the channel region of the floating gate devices in the inhibited bitlines.

FIG. 4 shows a graph of the decay curve of the voltage in the channel region 206 for the example given in FIG. 3, with 16 volts along wordline 100f and 8 volts along the channel region 206 of the floating gate device 104b' located on wordline 100f and bitline 102b' at time 0.

The graph includes one axis with Volts and the other axis with time. Vch indicates channel region 206 volts and Vg indicates floating gate 200 volts. The graph also includes a decay curve 300 and a pulse width 302. As FIG. 4 illustrates, the initial 8 volts in the channel region 206 of the floating gate device 104 decays over time. An example of a voltage in the channel region 206 which would prevent programming might be 8 volts while 6 volts in the channel region 206, given 16 v applied to wordline 6, may be too small to avoid programming the floating gate device 104. In the example, the 8 volts in the channel region 206 would cause a voltage differential of 8 volts which may be small enough to avoid programming. However, 6v in the channel region 206 causes a differential of 10v (16v–6v=10v) which may be high enough to cause the unselected floating gate device 104 to program. The time it takes for the 8 volts to decay down to 6 volts depends on the decay curve 300.

The length of time in which the voltage applied along the desired wordline 100 is known as the pulse width 302. In this example, this pulse width 302 cannot be longer than the time it takes the channel region 206 to decay from 8 volts to 6 volts, otherwise unselected floating gate devices 104 will begin programming. Alternatively, the pulse width 302 may be fixed in which case the voltage in the channel region 206 needs to remain higher than 6 volts during the pulse width 302. The decay rates represented by the decay curve 300, of the channel 206 voltage depends on how fast electrons are moving into the channel region 206. This motion of electrons moving into the channel region 206 can be caused by band to band tunneling current.

Figure 5:
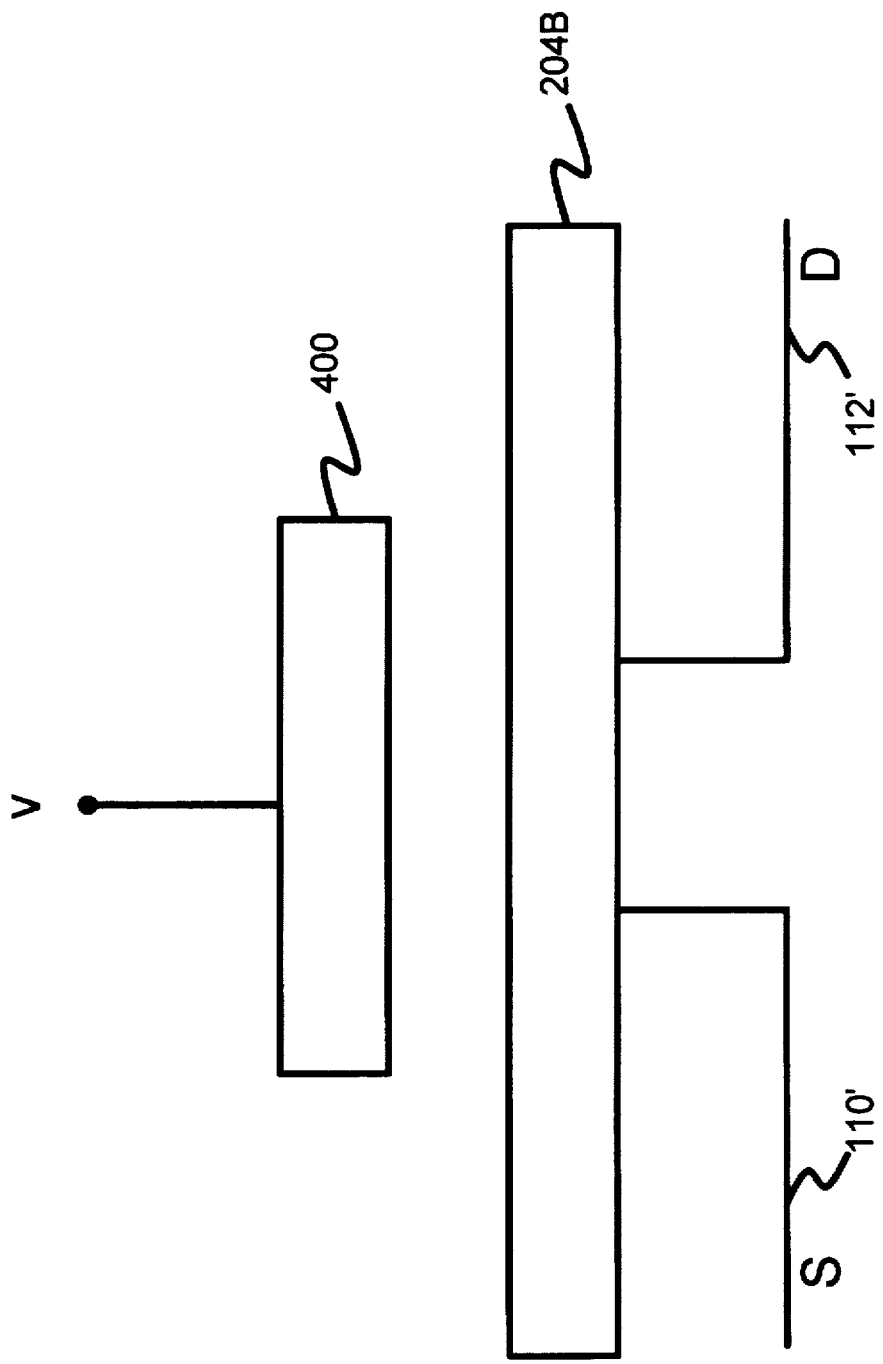
FIG. 5 is an illustration of a conventional transistor.

FIG. 5 shows a conventional transistor 114 which includes a gate 400, silicon dioxide 204b, a source 110', and a drain 112'. Note that if a modified floating gate device 104 is used instead of the conventional transistor 114, the modification is such that the end result is typically equivalent to the conventional transistor 114. Methods of modifying a floating gate device 104 to function as a conventional transistor 114 is well known in the art. One well-known method is to connect the control gate 201 to the floating gate 200. For simplicity, the term transistor 114 will refer to either a conventional transistor or a modified floating gate device 104 acting as such.

The band to band tunneling current occurs when there is a high voltage on the drain 112' or the source 110' of the transistor 114 combined with a low voltage on the gate 400 of the transistor 114. As previously discussed, due to the architecture of the conventional Flash memory 10, the devices 104 are coupled via the connection of the source 110' of one device 104 with the drain 112' of the next device 104.

At the select gate source 108, 108', the source 110 of the last device 104 is typically connected to the drain 112' of the transistor 114.

The size of the band to band tunneling current depends on multiple factors. The factor utilized by the conventional Flash memories 10A such as Samsung's KN29V32000RS-RS, is the thickness of the silicon dioxide 204b ($SiO_2$) of FIG. 5. The thicker the silicon dioxide 204b, the lower the band to band tunneling current becomes.

The problem with using this solution in the conventional Flash memory 10 is that an oxide tunneling current is used for programming and erasing the floating gate devices 104. In order to facilitate an oxide tunneling current, the silicon dioxide 204a of the floating gate devices 104 of FIG. 2 needs to be thin enough to let the electrons tunnel through the silicon dioxide 204a. So the conventional systems require growing two oxide thicknesses, the thin oxide 204a for the floating gate devices 104 to allow programming and erasing, and the thick oxide 204b for the select gate drain transistors 114, and select gate source transistors 114 to avoid band to band tunneling leakage. However, when the oxide 204 is grown in two different thicknesses, the quality of the oxide 204 is degraded.

The present invention solves the problem of the band to band tunneling current which decays the voltage in the channel region 206 by exploiting a different factor than the conventional Flash memory 10. The conventional Flash memory 10 vary the silicon dioxide 204 thickness to reduce the band to band tunneling current and thus slow down the decay of the voltage in the channel region 206. The present invention, on the other hand, effectively reduces the voltage difference between the last floating gate device 104 and the select gate source 108, thus reducing the band to band tunneling current.

In order to accomplish this, the preferred embodiment of the present invention utilizes a multiple select gate source device. The present invention also utilizes floating gate devices 104 of FIG. 2 to replace the conventional transistor 114 of FIG. 5 as a select gate device. In particular, the select gate source device is preferably a dual floating gate device 104 rather than the conventional transistor 114 (or device functioning as a conventional transistor) used in the current Flash memory systems 10 as a select gate device.

One major advantage of this architecture is the ability to use the same thickness of oxide 204 of FIGS. 2 and 5 throughout the Flash memory system. Growing one uniform thickness of oxide 204 enhances oxide 204 quality and allows a simpler process by eliminating the need to grow two different thicknesses of oxide 204. Another advantage flows from the conventional systems' use of a modified floating gate device for use as a conventional transistor 114. By eliminating the use of the conventional transistors 114 as the select gate devices, the present invention avoids the step of modifying the floating gate devices for use as a conventional transistor 114.

Figure 6:
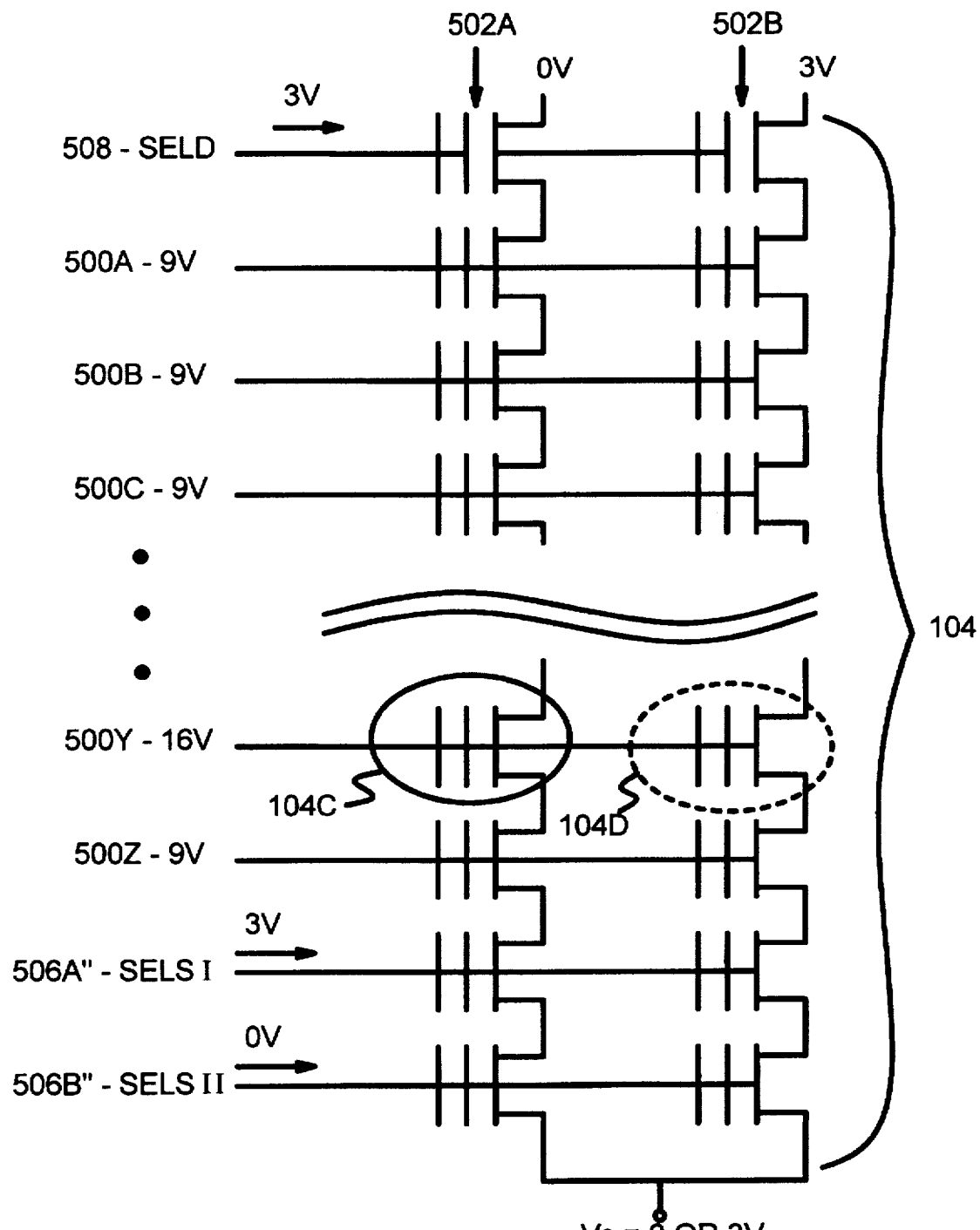
FIG. 6 is a preferred embodiment of the system and method according to the present invention.

FIG. 6 illustrates the preferred embodiment of the present invention. It shows a plurality of wordlines 500a–500c and 500y–500z intersected with a plurality of bitlines 502a–502b, a select gate drain 508 and a dual floating gate device 104 select gate source 506a–506b. Although the select gate source 506 and the select gate drain 508 may be interchangeable, for clarity, the example of the preferred embodiment illustrated in FIG. 6 will fix one end of the Flash memory as a select gate source 506, and the other end as the select gate drain 508.

Although the select gate drain 508 may be a conventional transistor 114 or a floating gate device modified to act as a conventional transistor 114, it is preferably an unmodified floating gate device 104. The select gate source 506 is a multiple select gate source 506 device. It is preferably two floating gate devices 104. The use of a floating gate device 104 for the select gate devices simplifies the process and avoids scaling issues. For purposes of clarity, an illustration of the use of the present invention is presented. The first set of floating gate devices 104 used as part of the select gate source device 506 will be referred to as SELS I 506a, while the second set of floating gate devices 104 used as part of the select gate source 506 device will be referred to as SELS II 506b. A voltage high enough to prevent programming of unselected floating gate devices 104d is coupled from wordlines 500a-z into the bitline 502b containing the unselected floating gate devices 104d. An example of such a voltage may be 8 volts. The select gate drain 508 has a voltage such as 3 volts while SELS II 506b has a 0 voltage and SELS I 506a has 0 or slightly larger voltage. SELS I 506a may apply a small voltage such as 3 volts. SELS I 506a can also apply 0 volts as long as SELS I 506a has a threshold voltage such as −2 volts. Causing the floating gate 200 of the floating gate device 104 to change its voltage is well known in the art and can be readily applied by someone skilled in the art.

Regardless of which small voltage is applied to SELS I 506a, the end result of the floating gate device of SELS I 506a is to reduce the differential between the drain 112 of the last floating gate device 104 prior to the select gate source 506, and the floating gate 200 of the first floating gate device 104 used as part of the select gate source 506. This reduction of the voltage differential results in a reduction of the band to band tunneling current.

This multiple floating gate device 104 system used as the select gate source 506 reduces the amount of band to band tunneling current and thus reduces the voltage decay of the channel area 206.

Figure 7A:
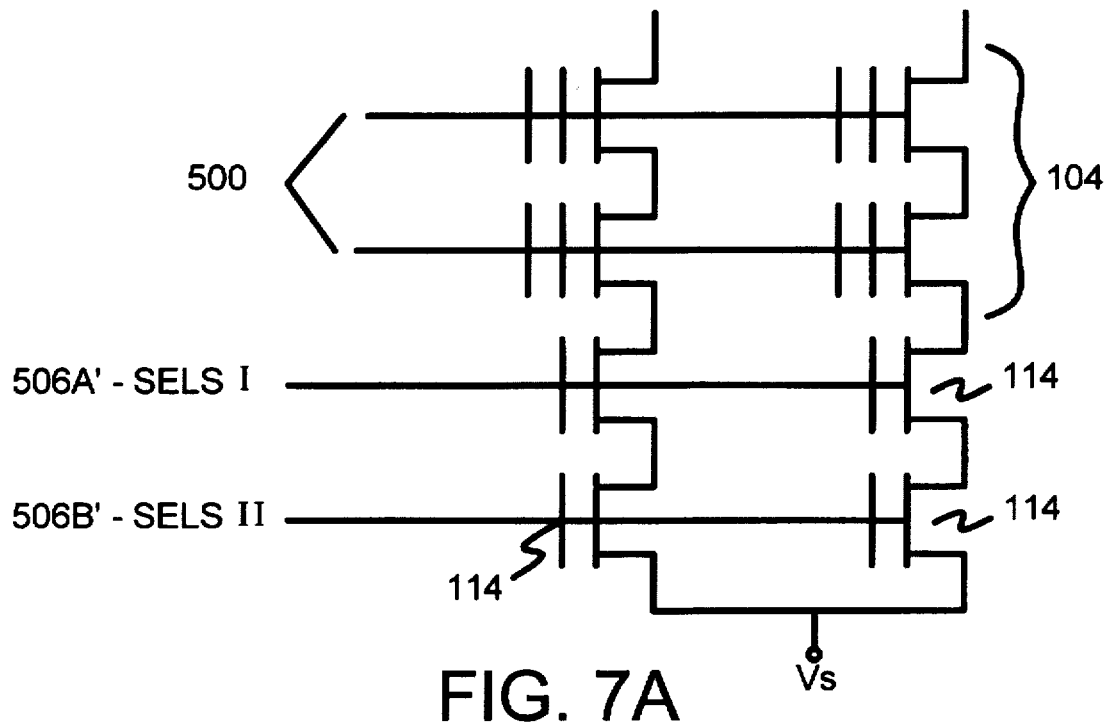
FIGS. 7A and 7B illustrates two other embodiments of the select gate source device according to the present invention.
Figure 7B:
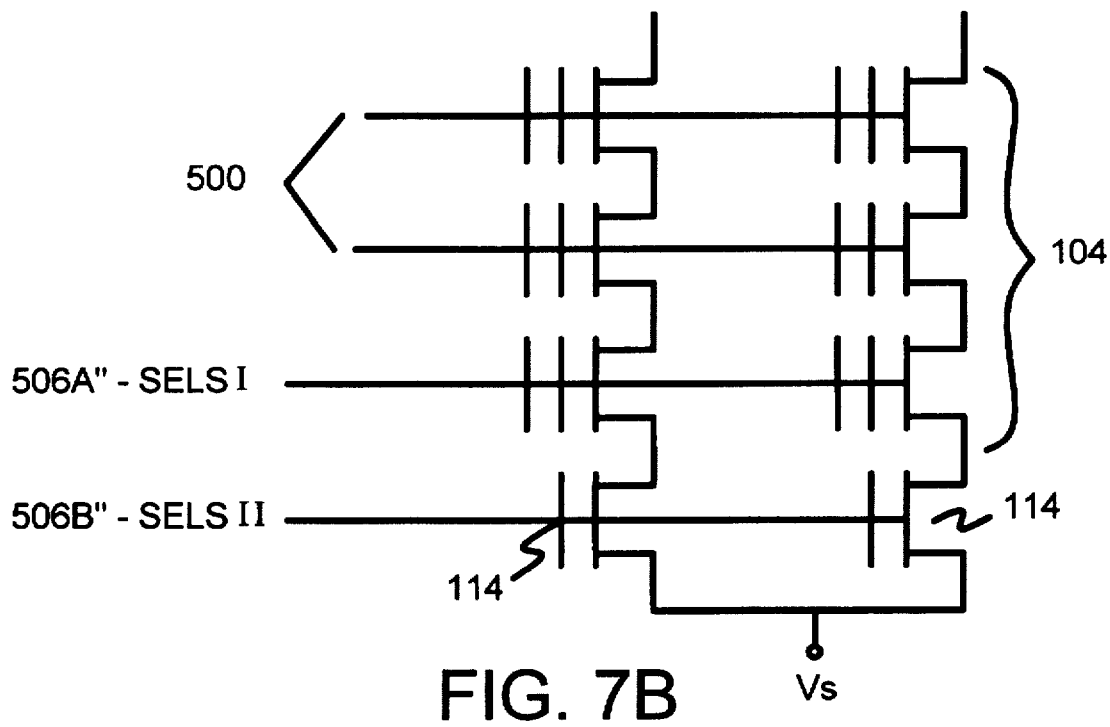

FIGS. 7A and 7B illustrate two other embodiments of the select gate source device 506 according to the present invention. 506a' and 506b' are a plurality of sets of transistors 114 used as the select gate source device 506, as shown in FIG. 7A. FIG. 7B shows a select gate source device 506 using both floating gate devices 104 and transistors 114.

Figure 8A:
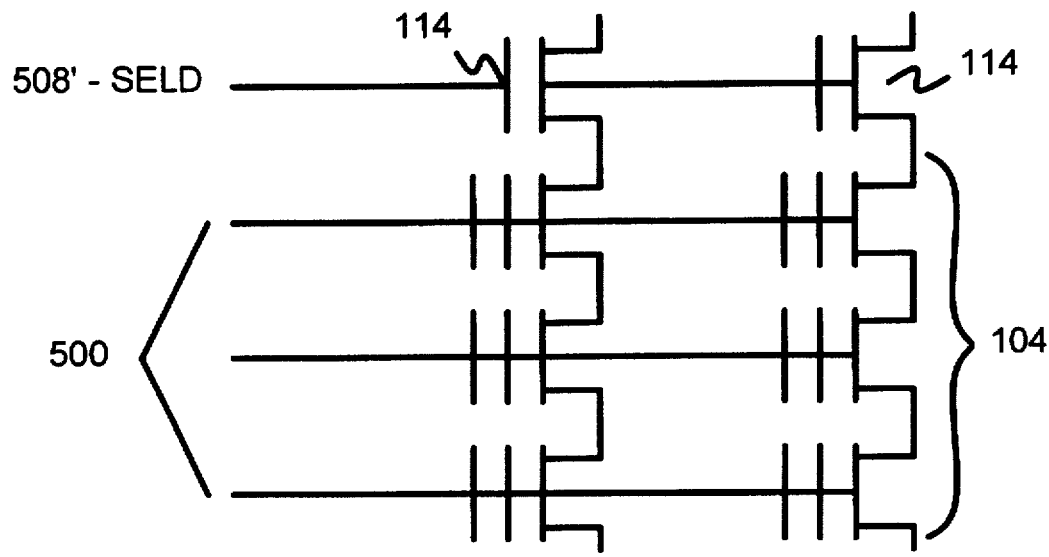
FIGS. 8A–8D illustrates additional embodiments of the select gate drain device according to the present invention.
Figure 8B:
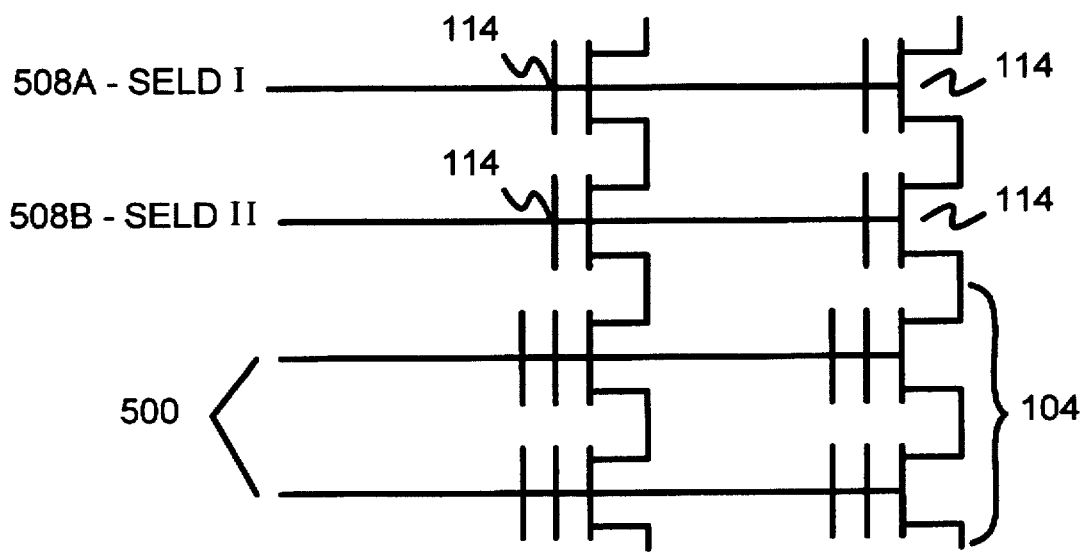
Figure 8C:
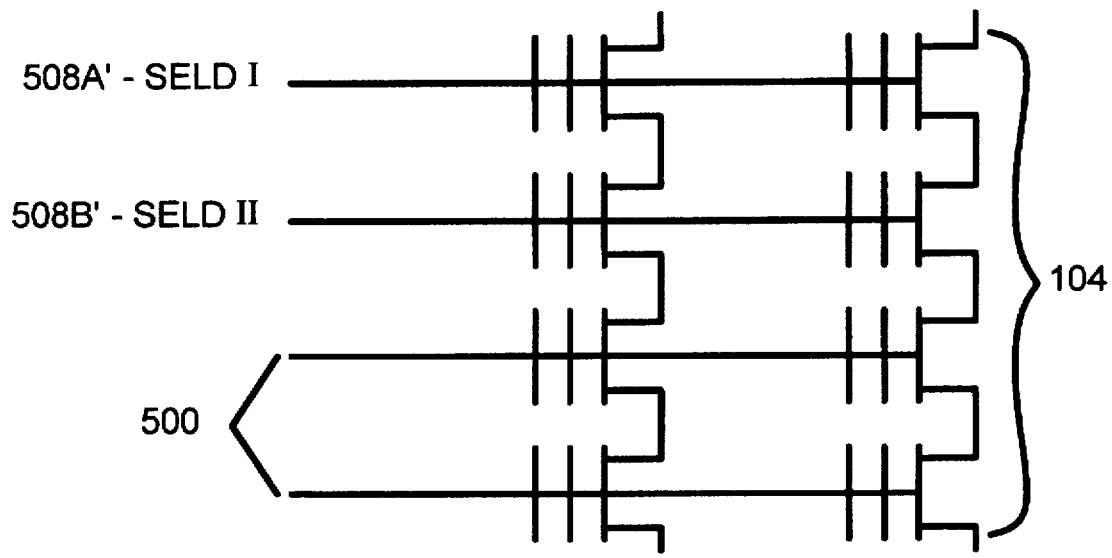
Figure 8D:
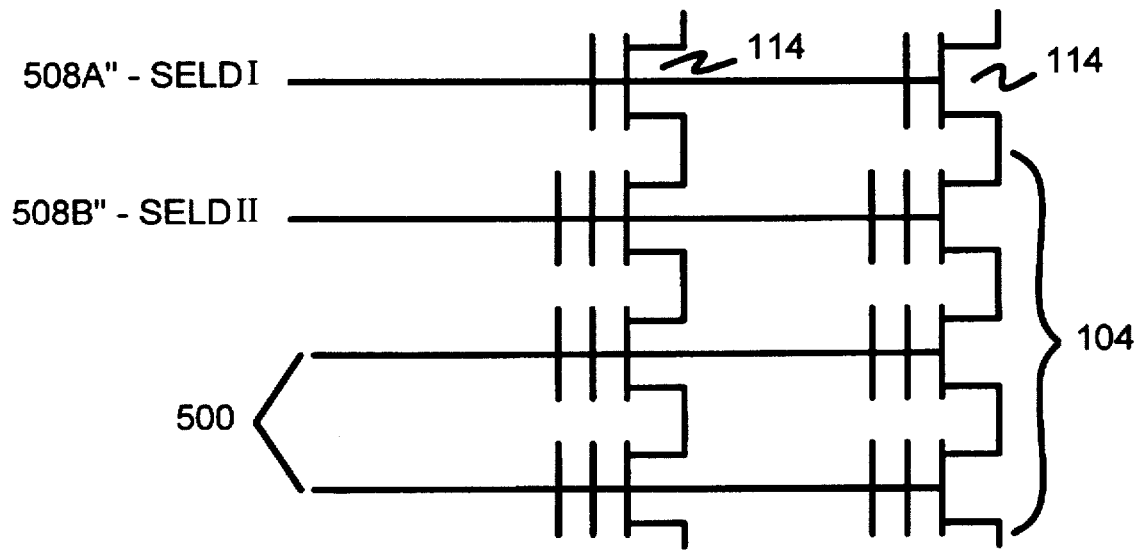

FIGS. 8A–8D illustrate additional embodiments of the select gate drain device 508. FIG. 8A shows a select gate drain device 508' comprising transistors 114. FIG. 8B shows a select gate drain device 508a and 508b with a plurality of sets of transistors 114. FIG. 8C shows a select gate drain device 508a' and 508b' with a plurality of sets of floating gate devices 104. FIG. 8D shows a select gate drain device 508a" and 508b" with both transistors 114 and floating gate devices 104.

Because the present invention reduces the band to band tunneling current via the use of multiple, preferably dual, floating gate devices 104 rather than via a thick oxide 204, it has the advantage of using only a single thickness for the oxide 204 throughout the Flash memory. Consequently, only the desired floating gate device 104 will be programmed without the need for growing different thicknesses of oxide 204.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for inhibiting random programming in a Flash memory, comprising:
   a) providing a first voltage in a channel region of a floating gate device in which programming is undesirable, the first voltage being initially high enough to prevent the floating gate device from being programmed;
   b) providing a second voltage in a first select device included in a select means coupled to the floating gate device in which programming is undesirable, wherein the second voltage is less than the first voltage; and
   c) providing a third voltage in a second select device, the second select device being included within the select means and coupled to the first select device, wherein the third voltage is less than the second voltage.

2. The method of claim 1, wherein the third voltage is zero.

3. The method of claim 1, wherein the first and second select devices are floating gate devices.

4. The method of claim 1, wherein the first and second select devices are transistors.

5. The method of claim 1, wherein the first and second select devices include at least one transistor and at least one floating gate device.

6. A system for inhibiting random programming in a Flash memory, comprising:

means for providing a first voltage in a channel region of a floating gate device in which programming is undesirable, the first voltage being initially high enough to prevent the floating gate device from being programmed;

means for providing a second voltage in a first select device included in a select means coupled to the floating gate device in which programming is undesirable, wherein the second voltage is less than the first voltage; and means for providing a third voltage in a second select device, the second select device being included within the select means and coupled to the first select device, wherein the third voltage is less than the second voltage.

7. The system of claim 6, wherein the third voltage is zero.

8. The system of claim 6, wherein the first and second select devices are floating gate devices.

9. The system of claim 6, wherein the first and second select devices are transistors.

10. The system of claim 6, wherein the first and second select devices include at least one transistor and at least one floating gate device.

\* \* \* \* \*